United States Patent [19]

Hagiwara

[11] Patent Number: 4,970,465

[45] Date of Patent: Nov. 13, 1990

[54] MAGNETIC RESONANCE IMAGING SYSTEM AND METHOD

[75] Inventor: Masayuki Hagiwara, Ootawara, Japan

[73] Assignee: Kabushiki Kaisha Toshiba, Kawasaki, Japan

[21] Appl. No.: 392,022

[22] Filed: Aug. 10, 1989

[30] Foreign Application Priority Data

Aug. 15, 1988 [JP] Japan .............................. 63-203014

[51] Int. Cl.$^5$ ........................................... G01R 33/20
[52] U.S. Cl. .................................... 324/309; 324/307
[58] Field of Search ............... 324/300, 307, 309, 310, 324/311, 312, 313, 314, 318, 322; 128/653

[56] References Cited

U.S. PATENT DOCUMENTS

| | | | |
|---|---|---|---|
| 4,545,384 | 10/1985 | Kawachi | 324/309 |
| 4,651,097 | 3/1987 | Iwaoka et al. | 324/309 |

*Primary Examiner*—Michael J. Tokar
*Attorney, Agent, or Firm*—Foley & Lardner, Schwartz, Jeffery, Schwaab, Mack, Blumenthal & Evans

[57] ABSTRACT

A magnetic resonance imaging system comprises a static field generating section, a gradient field applying section, a high-frequency pulse applying section, a sequence control section, a receiving section, and an imaging processing section. The sequence control section includes a first echo excitation section for sequentially applying a 90° pulse and a 180° pulse to the object, thereby generating a first magnetic resonance echo signal, a second echo excitation section for applying a 180° pulse once again after the first magnetic resonance echo signal is generated, thereby generating a second magnetic resonance echo signal, and a compensating section for applying a gradient magnetic field to the object in accordance with a predetermined sequence pattern, between the first magnetic resonance echo signal and the second magnetic resonance echo signal, thereby causing the phase of a magnetic resonance echo signal corresponding to a specific moving atomic nucleus to match with the phase of a magnetic resonance echo signal corresponding to a specific static atomic nucleus at a time instance corresponding to a peak of the second echo signal.

10 Claims, 4 Drawing Sheets

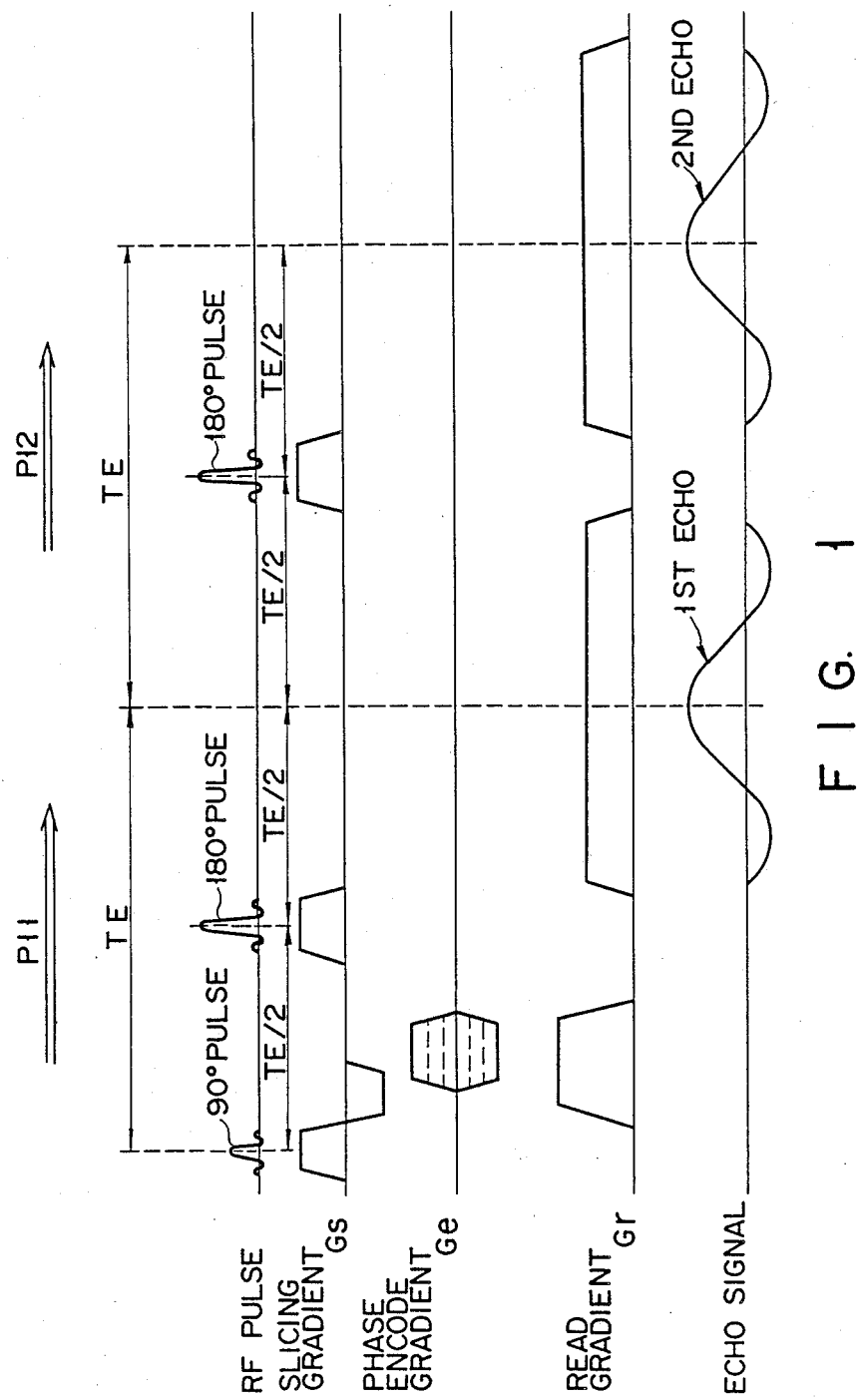
F I G. 1

MAGNETIC RESONANCE IMAGING SYSTEM AND METHOD

BACKGROUND OF THE INVENTION

1. Field of the Invention

The present invention relates to a magnetic resonance imaging (MRI) system for exciting magnetic resonance in a specific portion of an object to be examined, which is placed in a static magnetic field, by applying a gradient magnetic field and high-frequency pulses (RF pulses) to the object, acquiring magnetic resonance (MR) echo signal data produced by magnetic resonance, and imaging the specific portion by using the MR echo signal data in accordance with a predetermined image reconstruction method. In particular, this invention relates to a magnetic resonance imaging (MRI) system and method employing a multiecho method in which a first MR echo signal is acquired by a spin echo (SE) method and then second and following MR echo signals are acquired by repeatedly applying 180° pulses, wherein motion artifact due to the second and following MR echo signals can be prevented.

2. Description of the Related Art

In a general medical MRI system, a gradient magnetic field and a high-frequency pulse are applied to an object to be examined, which is placed in a static magnetic field, in accordance with a predetermined sequence for magnetic resonance (MR) excitation/magnetic resonance (MR) data acquisition. As a result, an MR phenomenon occurs in a specific portion of the object. As a result, an MR phenomenon occurs in a specific portion of the object. An MR signal induced by the MR phenomenon is detected. By subjecting the acquired MR data to imaging data processing including image reconstruction, the anatomical data or quality data of the specific portion of the object is imaged.

A conventional MRI system of this type generally comprises a static field generator, X-, Y-, and Z-axis gradient field generators, and high-frequency transmitter and receiver. When the X-, Y-, and Z-axis gradient field generators and the high-frequency transmitter are driven in accordance with a predetermined sequence, X-, Y-, and Z-axis gradient fields Gx, Gy and Gz and a high-frequency pulse are generated with a predetermined sequence pattern. As a result, an MR signal is generated and received by the receiver. The reception data is then subjected to predetermined image processing including image reconstruction. The tomographic image of a certain slice portion of an object to be examined is generated in this manner, and is displayed on a monitor.

In the sequence of MR excitation/MR data acquisition, the X-, Y-, and Z-axis gradient fields Gx, Gy and Gz are respectively used as, for example, a read gradient field Gr, and encoding gradient field Ge, and a slicing gradient field Gs.

As a conventional MR imaging method often used in such a system, there is known an imaging method based on a spin echo (SE) method using high-frequency pulses of 90° pulse-180° pulse sequence. In the spin echo method, data can be acquired by a multiecho sequence in which a single operation of magnetic resonance excitation allows successive generation of a plurality of magnetic resonance echoes. The SE method is often used for MR data acquisition using the multiecho sequence.

With reference to FIG. 1, a two-echo acquisition sequence for acquiring only a first echo (first MR echo) and a second echo (second MR echo) by using a multiecho method will now be described as an example of MR data acquisition using a multiecho sequence in a conventional SE method. FIG. 1 shows a sequence in a single encoding step.

In a first phase P11 of the sequence, a 90° pulse and a slicing gradient field Gs are applied to an object to be examined to excite a predetermined slice of the object (the magnetization vector in the slice is flipped by 90°). Thereafter, an encoding gradient field G2 having an amplitude corresponding to an encoding step is applied to the object, and then a 180° pulse is applied to the object to refocus a spin phase. After a time period TE (echo time) from the application of the 90° pulse, a first echo signal is acquired, while a read gradient field Gr is applied to the object.

In a second phase P12, after a time period TE/2 from the peak of the first echo signal, a 180° pulse is applied to the object. Further, after a time period TE/2 from the application of the 180° pulse (i.e., after a time period TE from the peak of the first echo signal), a read gradient field Gr is applied to the object so that the peak of a second echo signal appears at this time. The second echo signal is acquired in the state wherein the read gradient field Gr is being applied to the object.

The above sequence is repeated such that the amplitude of the encoding gradient field Ge applied between the 90° pulse and 180° pulse in the first phase P11 is varied by a predetermined value in every encoding step.

Third and following echo signals can be acquired in the following manner. As in the case where the second echo signal is acquired in the second phase, a 180° pulse is repeatedly applied after the time period TE/2 from the peak of the previous echo signal and the read gradient field Gr is applied to the object. Thus, an echo signal, the peak of which appears after the time period TE/2 from the application of the 180° pulse, is acquired.

According to the above-described multiecho sequence data acquisition method, the intensities of the second and following signals gradually lower, and the S/N is inevitably lowered. However, a number of MR signals (MR data) can be obtained by the execution of a single sequence. For example, a plurality of atomic nucleus density distribution images having different emphases of relaxation time constant information can be obtained. Thus, this acquisition method is advantageous in clinical examinations.

However, in the above-described multiecho sequence MR data acquisition method, because of the degradation in S/N in the second and following echo signals, the influence due to movement of atomic nuclei is not negligible, and artifact in images due to the second and following echo signals becomes considerable. Consequently, the definition of image is degraded, and it becomes difficult to exactly distinguish, for example, a normal tissue from a diseased part.

SUMMARY OF THE INVENTION

The object of the present invention is to provide an MRI system and method, wherein the definition of an image is prevented from being degraded owing to a second and following echo signals acquired in a multiecho signal acquisition process, and the quality of an MR image obtained by the multiecho signal acquisition process can be increased.

The MRI system of the present invention comprises a static magnetic field generating section for generating a sufficiently homogeneous static magnetic field in a predetermined imaging volume, a gradient magnetic field applying section for applying a gradient field to the imaging volume, a high-frequency pulse applying section for applying high-frequency pulses to the imaging volume, a sequence control section for controlling the gradient magnetic field applying section and the high-frequency pulse applying section in accordance with a predetermined sequence based on a multiecho method, by using high-frequency pulses of a 90° pulse-180° pulse sequence, so as to cause a magnetic resonance phenomenon in the imaging volume, a receiving section for receiving a magnetic resonance signal generated in the imaging volume by the magnetic resonance phenomenon, and an imaging processing section for performing predetermined processing, including image reconstruction processing, of the magnetic resonance signal, thereby obtaining a magnetic resonance image. Further, in the system of the present invention, when a second and following echo signals of multiecho signals are acquired, a predetermined gradient magnetic field, which is set such that the phase of an MR echo signal corresponding to a specific moving atomic nucleus and the phase of an MR echo signal corresponding to a specific static atomic nucleus match with each other at a peak of an echo signal, is applied to the object.

Furthermore, in the present invention, when the first echo signal is generated, it is desirable that a 180° pulse be applied to the object at a timing at which its center appears at time $t=TE'/2$, in the case where a center of a 90° pulse appears at time $t=0$ under the condition $TE'=TE-n\tau c$ (where TE is an echo time with respect to a proton, $\tau c$ is a period in which phases an MR echo signal corresponding to the protons of water and fat match with each other and which is obtained on the basis of a chemical shift of protons of water and the fat, and n is an integer not less than 1), and that a read gradient field Gr be applied such that its intensity is set to allow an echo peak to appear at time $t=TE=TE'+n\tau c$.

In the MRI system of the present invention, when the second echo signal is acquired, the gradient magnetic field, which is set such that the phase an MR echo signal corresponding to a specific moving atomic nucleus and the phase of an MR echo signal corresponding to a specific static atomic nucleus match with each other at a peak of an echo signal, is applied to the object. Therefore, a phase displacement due to motion of the specific atomic nucleus can be compensated, artifact due to the motion can be prevented, and an image of high definition can be obtained.

BRIEF DESCRIPTION OF THE DRAWINGS

FIG. 1 shows a pulse sequence in a conventional magnetic resonance imaging system;

DETAILED DESCRIPTION OF THE PREFERRED EMBODIMENTS

Figure 2:
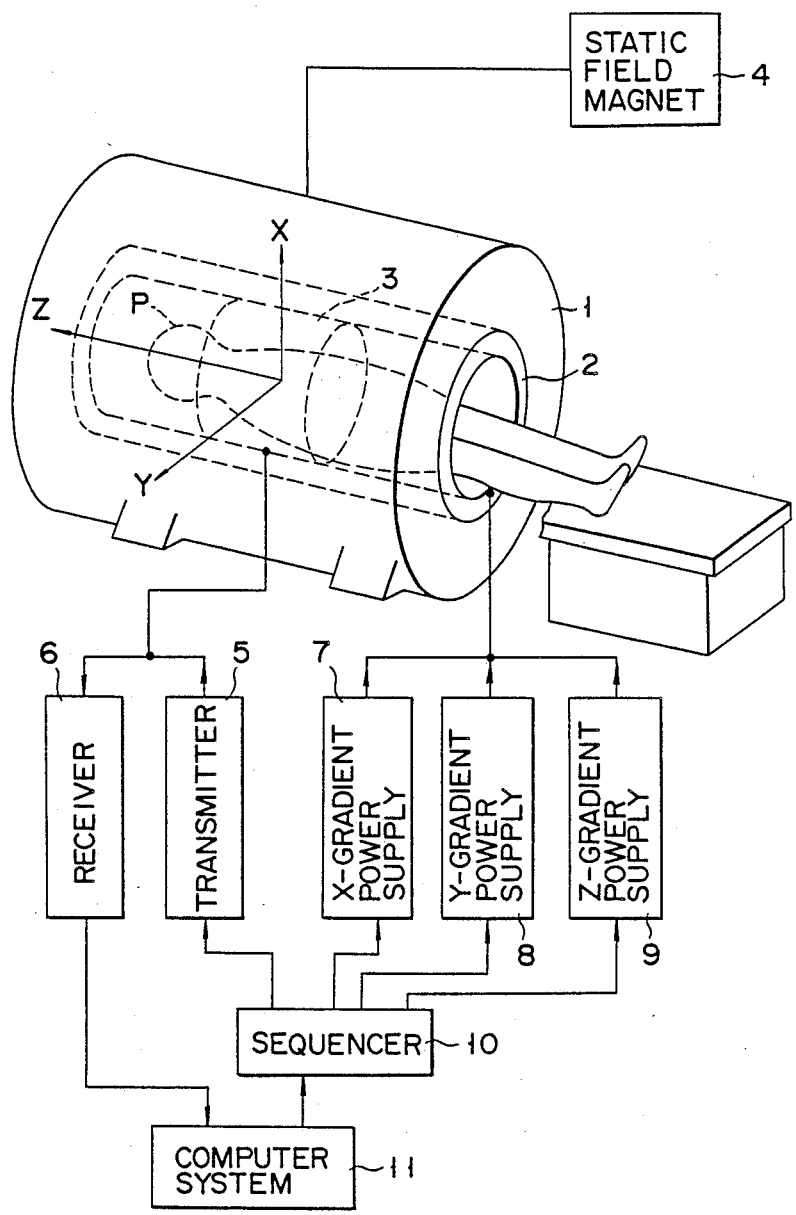
FIG. 2 shows a structure of a magnetic resonance imaging system according to an embodiment of the present invention.

A structure of a magnetic resonance imaging (MRI) system according to an embodiment of the present invention will now be described with reference to FIG. 2.

A static field magnet 1, X-, Y- and Z-axis gradient coils 2, and a transmission/reception coil 3 are arranged in a gantry 20. The static field magnet 1 serving as a static field generator is constituted by, for example, a superconductive or resistive coil. The X-, Y- and Z-axis gradient field coils 2 generate Z-, Y- and Z-axis gradient fields Gx, Gy and Gz. The transmission/reception coil 3 is used to generate a high-frequency pulse and to detect an MR signal generated by magnetic resonance. An object P to be examined is inserted in an imaging volume (a spherical volume in which an imaging magnetic field is formed and only in which diagnosis can be performed; the diameter of the spherical volume being abbreviated as DSV) in the gantry 20.

The static field magnet 1 is driven by a static field magnet controller 4. The transmission/reception coil 3 is driven by a transmitter 5 at the time of excitation and is driven by a receiver 6 at the time of detection of an MR signal. The X-, Y- and Z-axis gradient field coils 2 are respectively driven by X-, Y- and Z-gradient power supplies 7, 8, and 9.

The power supplies 7, 8 and 9 and the transmitter 5 are driven by a sequencer 10 in accordance with a predetermined sequence to respectively generate the X-, Y- and Z-axis gradient fields Gx, Gy and Gz and a high-frequency pulse of, for example, a 90° pulse-180° pulse sequence in accordance with a predetermined pulse sequence pattern to be described later. In this case, the X-, Y- and Z-axis gradient fields Gx, Gy and Gz are respectively used mainly as a read gradient field Gr, an encoding gradient field Ge, and a slicing gradient field Gs. A computer system 11 controls a sequencer 10. In addition, the computer system 11 generates a tomographic image of a predetermined slice portion of the object and display it on a display monitor by extracting spin echo signals as MR signals received by the receiver 6 and subjecting the spin echo signals to predetermined signal processing.

Figure 3:
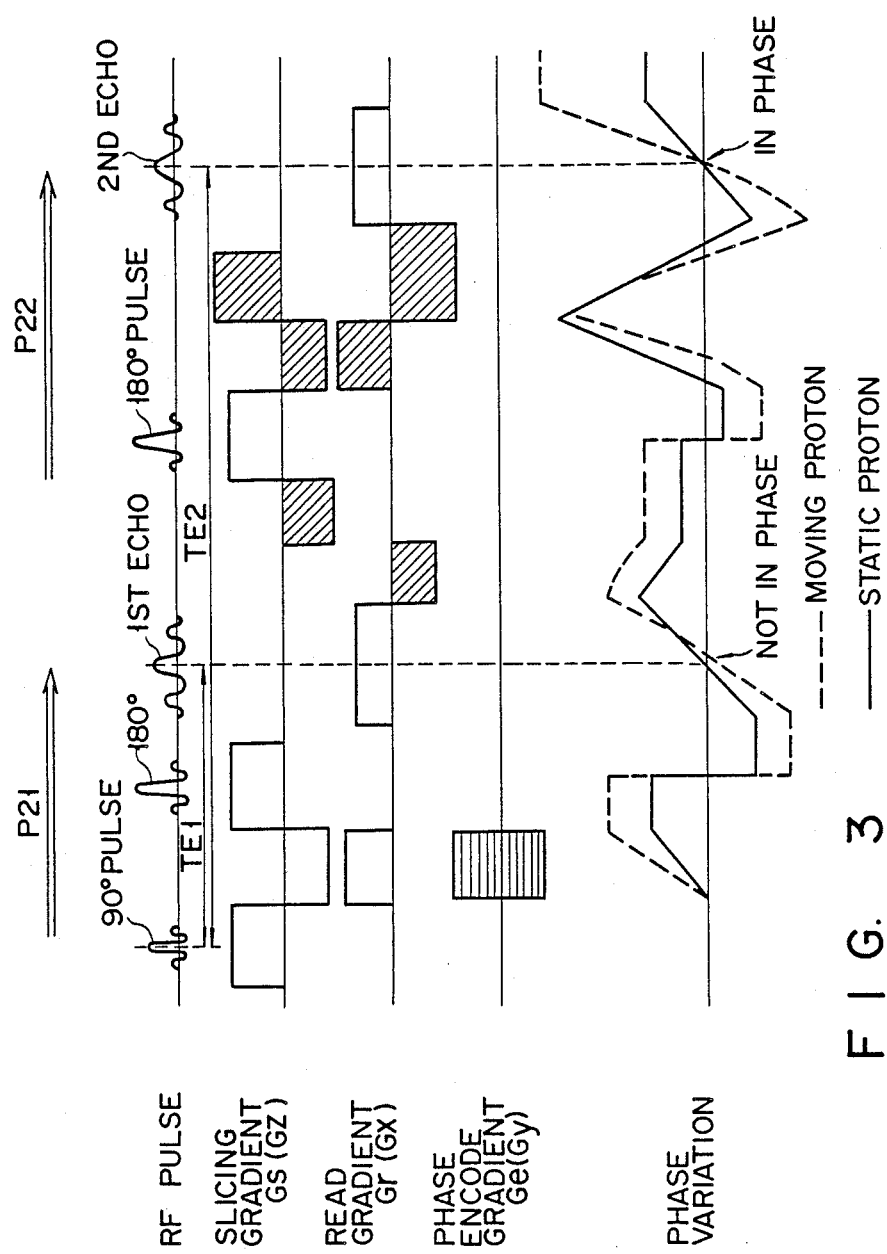
FIG. 3 is a view for explaining a pulse sequence in the system s in FIG. 2.

A pulse sequence for MR excitation/MR data acquisition in the above-described MRI system according to the embodiment of the present invention will now be described with reference to FIG. 3 showing a sequence corresponding to one encoding step, including the acquisition of first and second echo signals.

The first echo signal is acquired in a first phase P21 and the second echo signal is acquired in a second phase P22.

A hybrid echo method (hereinafter, referred to as "HE method"), in which a conventional SE method is improved to increase the S/N, is employed in the first phase P21. The HE method will be described later in detail. In the second phase P22, an improvement is made in the step of acquiring the second and following signals (magnetization is inverted and refocused by applying a 180° pulse) in the multiecho sequence of a conventional SE method. Namely, novel gradient fields (indicated by hatching in FIG. 3) are applied in order to eliminate artifact due to movement of specific atomic nuclei (for example, hydrogen atomic nuclei or protons; hereinafter, protons being used as typical atomic nuclei).

The HE method employed in the first phase P21 will now be described. A patent application for the HE method was already filed by the same applicant as the present application (U.S. Pat. Ser. No. 07/354,762; Inventors: Nazuto Nakabayashi and Masatoshi Hanawa; the Title: "Magnetic Resonance Imaging System and Method").

The HE method is based on the normal SE method. In the HE method, a 180° pulse is shifted toward a 90° pulse by a degree corresponding to one cycle of a chemical shift, whereby data acquisition time is extended and the S/N is increased by $\sqrt{2}$, compared to the normal SE method. However, in the HE method, only a high S/N is realized with respect to the first echo signal, and no consideration is given to artifact due to motion, flow, etc. of an object to be examined. Thus, an image based on the second echo signal contains considerably high motion artifact, i.e., artifact due to movement of protons, for example, resulting from a motion of an eyeball or a bloodstream.

The present embodiment is designed to reduce motion artifact in the second phase P22 for acquiring the second echo signal, which is subsequent to the execution of the HE method in the first phase P21.

In the HE method, a 180° pulse is generated at a timing at which its center appears at time $t=TE'/2$, in the case where a center of a 90° pulse appears at time $t=0$ under the condition $TE'=TE1-n\tau c$ (where TE1 is TE, i.e., an echo time with respect to a proton, $\tau c$ is a period in which phases of spins of the proton and fat match with each other and which is obtained on the basis of a chemical shift of protons of water and the fact, and n is an integer not less than 1). Also, in the HE method, the read gradient field $Gr$ is generated such that its intensity is set to make an echo peak appear at time $t=TE1=TE'+n\tau c$. Thus, according to the MRI system of the present invention, the echo signal acquisition time can be prolonged, and the S/N can be increased when the resolution and the TE time remain unchanged. Although a frequency deviation in spins occurs with respect to, for example, protons because of chemical shift, the phases of MR echo signals corresponding to the spins can be made to match with each other at the time when an echo peak is detected. If a frequency deviation in spins is caused by a factor other than chemical shift, the phases of MR echo signals corresponding to the spins may be made not to match with each other.

Since Taq' can be set over the limitation of $TE1-tw-2\alpha \geq Taq$, the S/N can be increased when the resolution and the TE time are kept unchanged. In addition, if the echo time TE1 is kept unchanged, the same contrast as in the conventional system can be obtained. Furthermore, if a frequency shift is caused by a factor other than chemical shift, the phases of MR echo signals corresponding to the spins do not match with each other at the time of an echo peak. Therefore, the same characteristics of echo signals as are obtained upon execution of a field echo method appear in a portion of the object, in which magnetic susceptibility locally varies. As a result, the portion (e.g., nucleus rubber) in which magnetic susceptibility locally varies can be expressed with a higher contrast than by a normal spin echo (SE) method.

As described above, by using the SE method, the S/N with respect to the resolution and the echo time TE can be increased.

Figure 4:
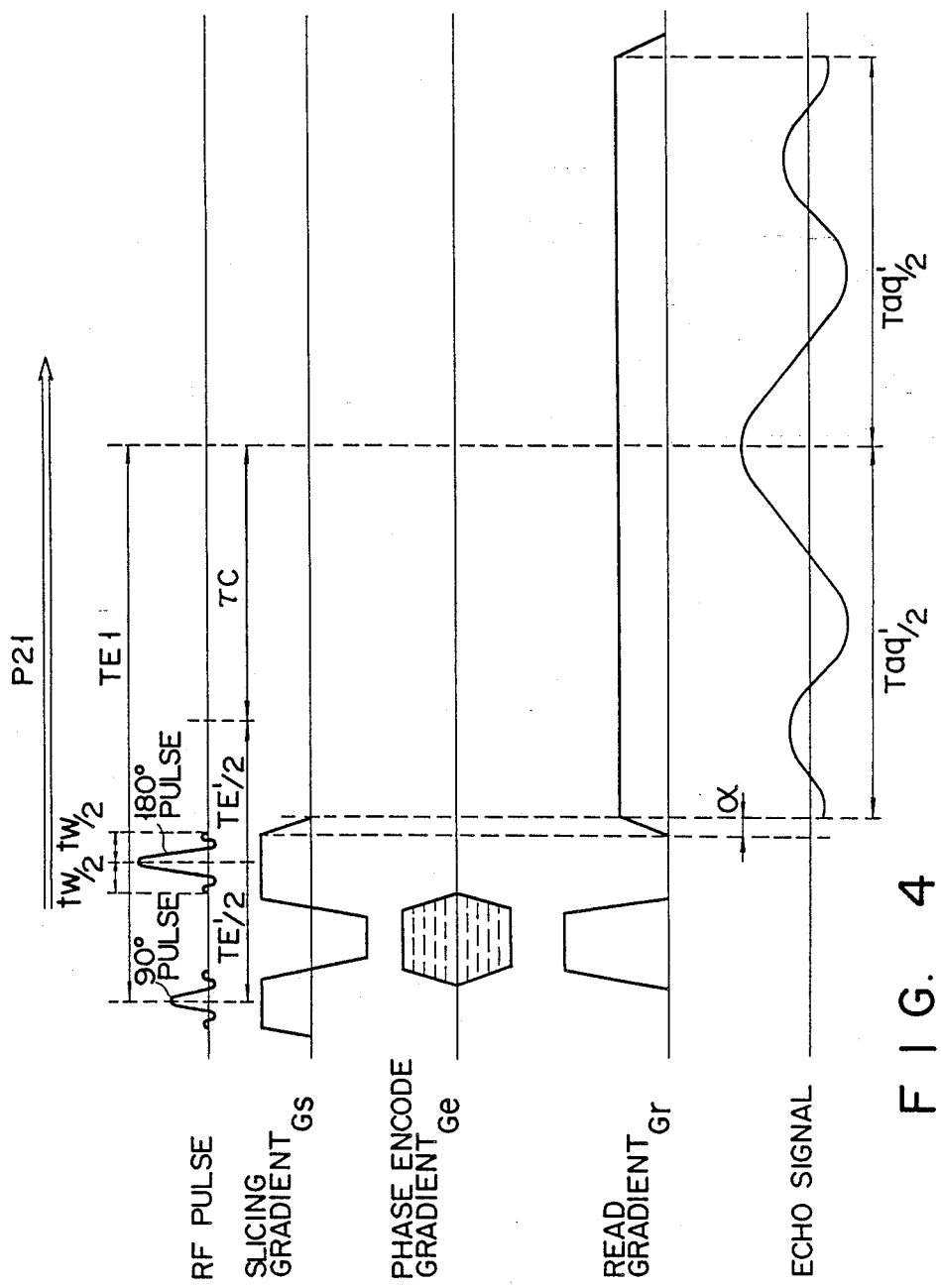
FIG. 4 is a view for explaining in detail a pulse sequence for obtaining a first echo in the system shown in FIG. 2.

With reference to FIG. 4, an example of the HE method will now be described.

The sequence shown in FIG. 4 is based on a spin echo sequence for applying high-frequency pulses of a 90° pulse-180° pulse sequence, and is constituted on the basis of an echo time TE1 of the spin echo sequence as follows:

(1) The resonant frequency of a proton (hydrogen atomic nucleus) (included in water) of water with respect to a static field generated by the system is obtained.

(2) The chemical shift amount of the proton of water and a proton (included in fat) of fat is normally 3.3 to 3.6 ppm with respect to the resonant frequency. A time (period) $\tau c$ during which the phases of spins of the water and the fat match with each other is obtained from the above values as follows:

$\tau c(\text{sec}) = 1/[(\text{resonant frequency (Hz) of water}) \times$ chemical shift amount (ppm) of water and fat]

(3) In association with the predetermined echo time TE1 of the above spin echo, a time corresponding to $TE1-\tau c$ is set to be a time TE'.

(4) Application timings of high-frequency 90° and 180° pulses are determined so as to allow time $t=0$ and $t=TE'/2$ to coincide respectively with the centers of the 90° and 180° pulses.

(5) Data acquisition can be started, at the earliest timing, from point B in FIG. 1 immediately after the end of the 180° pulse. For example, when data acquisition is to be performed in a symmetrical manner with respect to the peak (time $t=TE1$) of an echo signal, data can be acquired during a period Taq'.

(6) The slicing, read, and phase encoding gradient fields Gs, Gr and Ge can be basically controlled in the same manner as in a normal spin echo sequence. However, the echo peak of the read gradient field Gr appears at $t=TE'+\tau c$, i.e., $t=TE$, instead of $t=TE'$, and its intensity is set to obtain a desired resolution $\Delta l$ with respect to the period Taq'. In this case, the resolution $\Delta l$ is given as $\Delta l=[1/\text{Taq}' \times (\text{intensity of Gr in period Taq'})]$. The timing at which the echo peak appears is determined by the relationship between the integral values of the read gradient field Gr before application of the 180° pulse (between the 90° pulse and the 180° pulse) and after application of the 180° pulse. Therefore, the intensity of the read gradient field Gr in the period Taq' is determined to satisfy the resolution $\Delta l$. In accordance with the determined intensity, the intensity of the read gradient field Gr before application of the 180° pulse is determined to allow the echo peak to appear at $t=TE1$.

Since the pulse sequence in the HE method is susceptible to the influence of inhomogeneity of a static magnetic field, unlike the normal spin echo pulse sequence, an MRI system must be constituted by using a static field magnet system capable of obtaining a highly homogeneous static magnetic field. For example, with a static magnetic field intensity of 0.5 T, inhomogeneity in a volume having DSV=250 mm is preferably set to several ppm or less.

According to the above-described HE method, under the above condition (2), i.e., $\tau c(\text{sec})=1/[(\text{resonant frequency of water (Hz)}) \times (\text{chemical shift amount (ppm) of water and fat})]$, an image having the same contrast as that of an image obtained by the system using the conventional method can be obtained. If the resolution of an image is constant, noise of the image is reduced by a value corresponding to $1/\sqrt{(Taq'/Taq)}$. As a result, the S/N is increased.

The HE method executed in the first phase P21 has been described above.

In the present embodiment of the invention, the first echo signal is acquired by the above-described HE method. After the acquisition of the first echo signal, a 180° pulse is applied to obtain the second echo signal. Namely, the second echo signal is obtained by executing the sequence in the second phase P22 shown in FIG. 3.

In the second phase P22, after the first echo signal is obtained, the 180° pulse and the slicing gradient field Gs are applied to the object and the phases of spins are inversely refocused. Then, the read gradient field Gr is applied to the object to obtain the second echo signal. This operation is the same as that in the normal multiecho sequence. However, in the present invention, the gradient fields, indicated by hatching in FIG. 3, are newly added to the slicing gradient field Gs and the read gradient field Gr. The gradient fields indicated by hatching are set such that, for example, the phase of an MR echo signal obtained from the moving proton and the phase of an MR signal obtained from the static proton are made to match with each other, at a time instant corresponding to the peak of the second echo signal, that is, after time period TE2 from the peak of the 90° pulse, as shown in FIG. 3. The hatched gradient fields, for causing the phases of the MR echo signals obtained from the moving proton and static proton to match with each other at the time instant corresponding to the peak of the second echo signal, can be obtained by calculation.

The algorism of this calculation will now be described. Consideration will be given of the relationship between an echo signal source $\rho(x, y)$ at a point $(x, y)$ in an excited slice plane XY and an echo signal S (tx, ty) at a point (tx, ty) in a raw data plane (Fourier space plane) tx−ty. In this relationship, Gs, Gr and Ge correspond to Gz, Gx and Gy, $\gamma$ denotes a gyromagnetic ratio, TR denotes a repetition interval of a sequence (of each encoding step), and IT denotes a vertical relaxation time constant. Namely, $$S(tx,ty) = \int\int \rho(t,y)\text{ext}\,[-j2\pi\gamma\,\{\int Gs(tx)x(tx)dtx +$$

$$\int Gy(ty)y(ty)dty\}d \times dy$$

$$\rho(x,y) = \int \rho(x,y,z)\exp\{-j2\pi\gamma \int Gz(tz)z(tz)dtz\}dz$$

$$\rho(x,y,z) = \rho(x,y,z)[1 - \exp\{-TR/T1(x,y,z)\}]$$

If vectors x (xy) and y (ty) representing phases are developed as a function of time, $$x(tx) = x + Vxtx + (\tfrac{1}{2}) Axtx^2 + (1/6) Pxtx^3 + \ldots$$

$$y(ty) = Y + Vyty + (\tfrac{1}{2}) Ayty^2 + (1/6) Pyty^3 + \ldots$$

$$z(tz) = z + Vztx + (\tfrac{1}{2}) Aztz^2 + (1/6) Pztz^3 + \ldots$$

If only the direction x is considered, the phase signal is given by $$2\pi\gamma \int Gx(tx)x(tx)dtz$$

Using the above formulae, the following is given:

$$\pi\gamma \int Gx(tx)\{x + VxTx + (\tfrac{1}{2})Aztx^2 + (1/6)Pxtx^3\}dtx$$

In the above formulae, $$2\pi\gamma \int Gx(tx)xdtx = C0$$

$$2\pi\gamma \int Gx \cdot Vxtxdtx = C1$$

$$2\pi\gamma \int Gx \cdot (\tfrac{1}{2})Axtx^2 dtx = C2$$

$$2\pi\gamma \int Gx \cdot (1/6)Pxtx^3 dtx = C3$$

where C0 indicates the phase of the static proton, C1, C2 and C3 indicate a speed, an acceleration speed, and a phase of a higher order.

Gx or Gr for attaining C0=C1=C2=C3=0, whereby the phases of MR echo signals corresponding to all protons (moving proton, static proton, etc.) are made to match with each other at the peak of the second echo signal, are found. The value ty is set so that the time of application of Gr falls within a practically possible range, and the amplitude of Gr is set to a practically possible value. Based on these values, Gr (Gx) is determined.

Concerning Gz or Gs, Gs (Gz) is found in order to make the phases of all protons match with each other at the peak of the second echo signal. The hatched fields in FIG. 3 are obtained in this manner.

According to the present invention, in the HE method in which motion artifact is particularly high in the second and following signals, gradient fields are combined so that the phases of MR echo signals corresponding to the moving proton and static proton are matched with each other. Therefore, an image in which artifact due to motion of a body or a flow of humor (e.g., bloodstream) can be obtained. Since the definition of the image is increased, a normal tissue and a diseased portion can be clearly distinguished, and the diseased portion can be easily found.

In the above embodiment, the HE method has been employed in the first phase P21 for acquiring the first echo signal. However, other method such as a normal SE method may be employed. Of course, the technique of the present invention for eliminating motion artifact is applicable to the third and following echo signals or to the first echo signal.

Other various modifications and changes can be made to the present invention within the spirit of this invention.

What is claimed is:

1. A magnetic resonance imaging system comprising:
    static magnetic field generating means for generating a static magnetic field in a predetermined imaging volume in which an object to be examined is placed;
    gradient magnetic field applying means for applying a gradient field to the imaging volume;
    high-frequency pulse applying means for applying high-frequency pulses to the imaging volume;
    sequence control means for controlling said gradient magnetic field applying means and high-frequency pulse applying means in accordance with a predetermined sequence so as to cause said gradient magnetic field applying means and high-frequency pulse applying means to respectively apply a predetermined gradient magnetic field and the high-frequency pulses of a 90° pulse-180° pulse sequence, thereby causing a magnetic resonance phenomenon in a predetermined section of the object placed in the imaging volume;

receiving means for receiving a magnetic resonance signal generated in the imaging volume by the magnetic resonance phenomenon; and imaging processing means for performing predetermined processing, including image reconstruction processing, of the magnetic resonance signal received by said receiving means so as to obtain a magnetic resonance image, said sequence control means including:

first echo excitation means for sequentially applying a 90° pulse and a 180° pulse to the object, thereby generating a first magnetic resonance echo signal;

second echo excitation means for applying a 180° pulse once again after said first magnetic resonance echo signal is generated, thereby generating a second magnetic resonance echo signal; and compensating means for applying said gradient magnetic field to the object in accordance with a predetermined sequence pattern, between said first magnetic resonance echo signal and the second magnetic resonance echo signal, thereby causing the phase of a magnetic resonance echo signal corresponding to a specific moving atomic nucleus to match with the phase of a magnetic resonance echo signal corresponding to a specific static atomic nucleus at a time instance corresponding to a peak of the second echo signal.

2. The system according to claim 1, wherein said first echo excitation means includes means for applying said gradient magnetic field to the object in accordance with a predetermined sequence pattern, between said 90° pulse and the first magnetic resonance echo signal, thereby causing the phase of a magnetic resonance echo signal corresponding to a specific moving atomic nucleus to match with the phase of a magnetic resonance echo signal corresponding to a specific static atomic nucleus at a time instance corresponding to a peak of the first echo signal.

3. The system according to claim 1, wherein said first echo excitation means includes means for generating a 180° pulse at a timing at which its center appears at time $t=TE'/2$, in the case where a center of a 90° pulse appears at time $t=0$ under the condition $TE'=TE-n\tau c$ (where TE is an echo time with respect to a proton, $\tau c$ is a period in which phases of spins of magnetic resonance echo signals corresponding to the protons of water and fat match with each other and which is obtained on the basis of a chemical shift of protons of water and the fat, and n is an integer not less than 1), and means for generating a read gradient field Gr such that its intensity is set to allow an echo peak to appear at time $t=TE=TE'+n\tau c$.

4. The system according to claim 1, wherein said gradient magnetic field applying means includes means for applying three gradient magnetic fields, namely, a slicing gradient magnetic field, an encoding gradient magnetic field and a read gradient magnetic field, and said compensating means produces said sequence pattern by using two gradient magnetic fields, namely, the slicing gradient magnetic field and the read gradient magnetic field.

5. A magnetic resonance imaging system comprising:

static magnetic field generating means for generating a static magnetic field in a predetermined imaging volume in which an object to be examined is placed;

gradient magnetic field applying means for applying a gradient field to the imaging volume;

high-frequency pulse applying means for applying high-frequency pulses to the imaging volume;

sequence control means for controlling said gradient magnetic field applying means and high-frequency pulse applying means in accordance with a predetermined sequence so as to cause said gradient magnetic field applying means and high-frequency pulse applying means to respectively apply a predetermined gradient magnetic field and the high-frequency pulses of a 90° pulse-180° pulse sequence, thereby causing a magnetic resonance phenomenon in a predetermined section of the object placed in the imaging volume;

receiving means for receiving a magnetic resonance signal generated in the imaging volume by the magnetic resonance phenomenon; and imaging processing means for performing predetermined processing, including image reconstruction processing, of the magnetic resonance signal received by said receiving means so as to obtain a magnetic resonance image, said sequence control means including:

means for sequentially applying a 90° pulse and a 180° pulse to the object, thereby generating a first magnetic resonance echo signal;

means for repeatedly applying a 180° pulse at a predetermined time interval after said first magnetic resonance echo signal is generated, thereby generating an n-th (n is a natural number of two or above) magnetic resonance echo signal; and means for applying said gradient magnetic field to the object in accordance with a predetermined sequence pattern, between said n-th magnetic resonance echo signal and an (n−1)th magnetic resonance echo signal, thereby causing the phase of a magnetic resonance echo signal corresponding to a specific moving atomic nucleus to match with the phase of a magnetic resonance echo signal corresponding to a specific static atomic nucleus at a time instance corresponding to a peak of the n-th echo signal.

6. A magnetic resonance imaging method of causing a magnetic resonance phenomenon in a predetermined area of an imaging volume in a static magnetic field in which an object to be examined is placed by applying a predetermined gradient magnetic field and high-frequency pulses of a 90° pulse-180° pulse sequence to the imaging volume, receiving a magnetic resonance signal generated by the magnetic resonance phenomenon, and obtaining a magnetic resonance image by subjecting the magnetic resonance signal to predetermined processing, including image reconstruction processing, wherein said method includes:

a first step of sequentially applying a 90° pulse and a 180° pulse to the object to generate a first magnetic resonance echo signal;

a second step of applying a 180° pulse once again after the first magnetic resonance echo signal is generated, thereby generating a second magnetic resonance echo signal; and a third step of applying said gradient magnetic field to the object in accordance with a predetermined sequence pattern, between said first magnetic resonance echo signal and the second magnetic resonance echo signal, thereby causing the phase of a magnetic resonance echo signal corresponding to a specific moving atomic nucleus to match with the phase of a magnetic resonance echo signal corresponding to a specific static atomic nucleus at a time instance corresponding to a peak of the second echo signal.

7. The method according to claim 6, wherein said first step includes a step of applying said gradient magnetic field to the object in accordance with a predetermined sequence pattern, between said 90° pulse and the first magnetic resonance echo signal, thereby causing the phase of a magnetic resonance echo signal corresponding to specific moving atomic nucleus to match with the phase of a magnetic resonance echo signal corresponding to a specific static atomic nucleus at a time instance corresponding to a peak of the first echo signal.

8. The method according to claim 6, wherein in said first step, a center of the application timing of the 180° pulse is set to $t = TE'/2$, in the case where a center of a 90° pulse appears at time $t=0$ condition $TE' = TE - n\tau c$ (where TE is an echo time with respect to a proton, $\tau c$ is a a magnetic resonance echo signal corresponding to period in which phases of spins of the protons of water and fat match with each other and which is obtained on the basis of a chemical shift of protons of water and the fat, and n is an integer not less than 1), and a read gradient field Gr, the intensity of which is set such that an echo peak appears at time $t = TE = TE' + n\tau c$, is applied to the imaging volume.

9. The method according to claim 6, wherein said gradient magnetic field includes three gradient magnetic fields, namely, a slicing gradient magnetic field, an encoding gradient magnetic field and a read gradient magnetic field, and in said third step said sequence pattern is produced by using two gradient magnetic fields, namely, the slicing gradient magnetic field and the read gradient magnetic field.

10. A magnetic resonance imaging method of causing a magnetic resonance phenomenon in a predetermined area of an imaging volume in a static magnetic field in which an object to be examined is placed by applying a predetermined gradient magnetic field and high-frequency pulses of a 90° pulse-180° pulse sequence to the imaging volume, receiving a magnetic resonance signal generated by the magnetic resonance phenomenon, and obtaining a magnetic resonance image by subjecting the magnetic resonance signal to predetermined processing, including image reconstruction processing, wherein said method includes:

a first step of sequentially applying a 90° pulse and a 180° pulse to the object to generate a first magnetic resonance echo signal;

a second step of repeatedly applying a 180° pulse at a predetermined time interval after the first magnetic resonance echo signal is generated, thereby generating an n-th (n=a natural number of two or above) magnetic resonance echo signal; and a third step of applying said gradient magnetic field to the object in accordance with a predetermined sequence pattern, between said n-th magnetic resonance echo signal and an (n−1)th magnetic resonance echo signal, thereby causing the phase of a magnetic resonance echo signal corresponding to a specific moving atomic nucleus to match with the phase of a magnetic resonance echo signal corresponding to a specific static atomic nucleus at a time instance corresponding to a peak of the n-th echo signal.

* * * * *